(12) United States Patent
Plötz et al.

(10) Patent No.: US 7,408,305 B2
(45) Date of Patent: Aug. 5, 2008

(54) CODABLE ELECTRONIC CIRCUIT ARRANGEMENT AND METHOD FOR PRODUCING IT

(75) Inventors: Ludwig Plötz, Arnschwang (DE); Markus Hofmann, Teugn (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 81 days.

(21) Appl. No.: 10/763,536

(22) Filed: Jan. 21, 2004

(65) Prior Publication Data

US 2004/0195979 A1      Oct. 7, 2004

(30) Foreign Application Priority Data

Jan. 29, 2003     (DE)     ................. 103 03 454

(51) Int. Cl.
*H05B 37/00*      (2006.01)
(52) U.S. Cl. ................. 315/185 R; 315/192; 315/363
(58) Field of Classification Search .............. 315/363, 315/185 R, 192; 362/800
See application file for complete search history.

(56) References Cited

U.S. PATENT DOCUMENTS 6,218,790 B1     4/2001   Jansa et al.
6,641,294 B2 *  11/2003   Lefebvre ................. 362/544

FOREIGN PATENT DOCUMENTS

DE     198 14 495 A1     4/1998

* cited by examiner

*Primary Examiner*—David H Vu
(74) *Attorney, Agent, or Firm*—Cohen Pontani Lieberman & Pavane LLP

(57) ABSTRACT

A codable electronic circuit arrangement, in particular an LED circuit arrangement (1), having a lead (3), via which electronic circuit elements (6) of the circuit arrangement, in particular LED components, can be driven by a drive circuit (2; 20; 21; 22). The lead (3) has a plurality of coding conductors (3c, 3d), which carry a code via a combination of electrically interrupted and electrically continuous coding conductors (3c, 3d), wherein the code gives an indication of specific properties of the circuit arrangement.

13 Claims, 5 Drawing Sheets

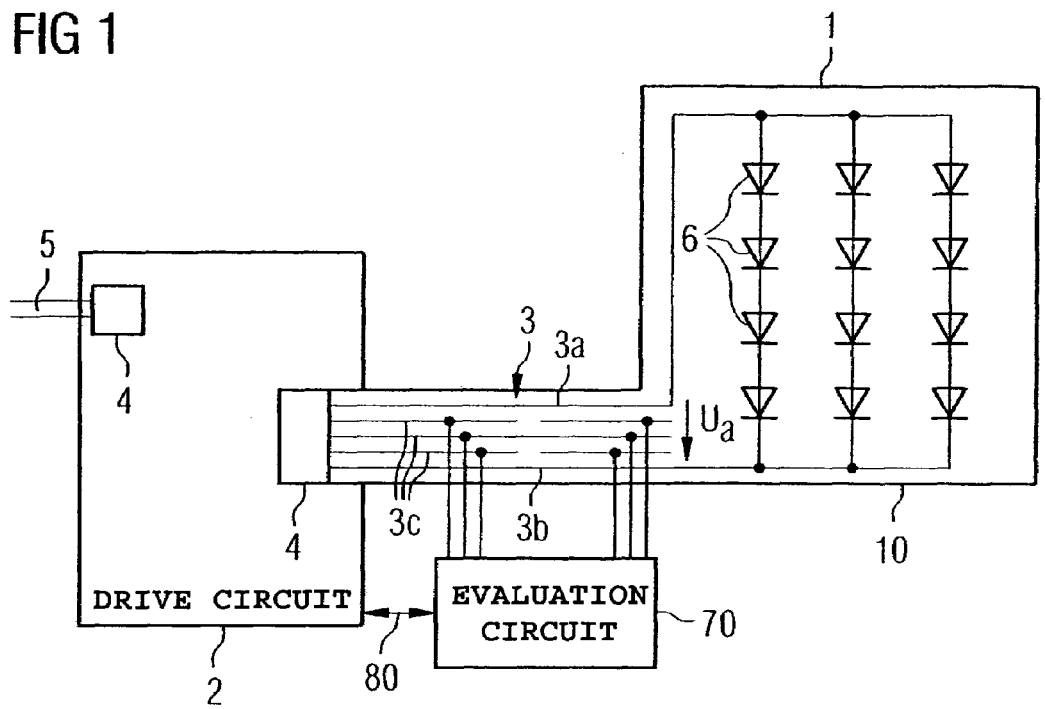
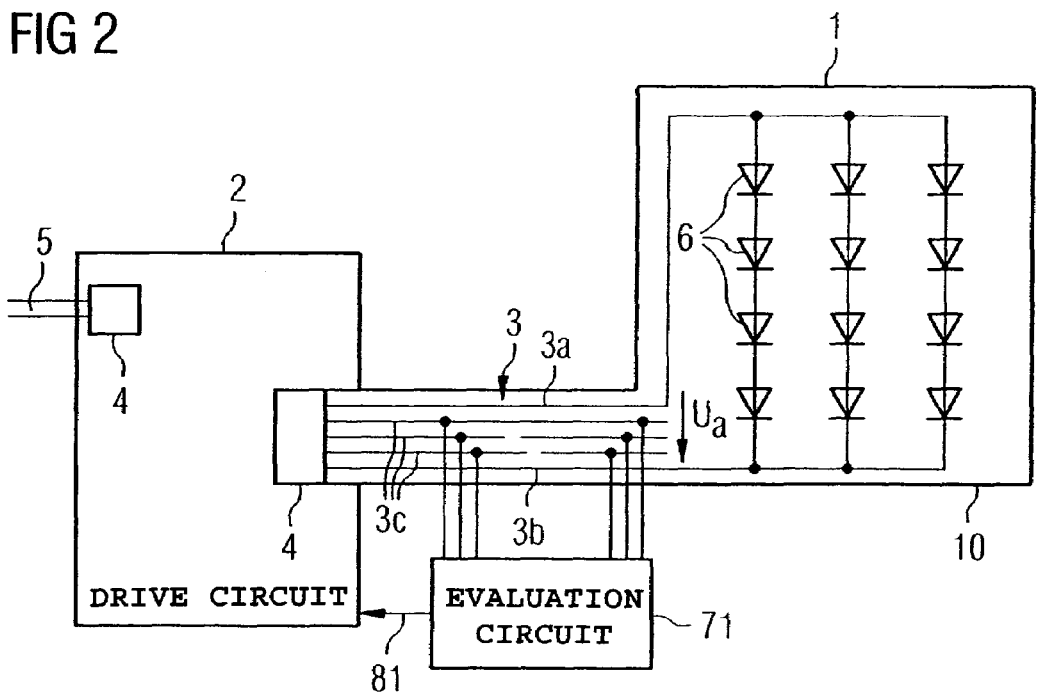

DRIVE CIRCUIT

CODABLE ELECTRONIC CIRCUIT ARRANGEMENT AND METHOD FOR PRODUCING IT

RELATED APPLICATIONS

This patent application claims the priority of German patent application 10303454.4-35, the disclosure content of which is hereby incorporated by reference.

FIELD OF THE INVENTION

The present invention relates to an electronic circuit arrangement, in particular a light-emitting diode (LED) circuit arrangement, having a codable lead in particular for a drive circuit (for example a driver module), via which at least one electronic circuit element, in particular at least one LED, can be driven by the drive circuit. It furthermore relates to a method for producing a coding of this type.

By means of a coding of the lead of an electronic circuit arrangement, it is possible, by way of example, to set different currents on a printed circuit board or different functions.

BACKGROUND OF THE INVENTION

In particular for LED rear luminaires in the automotive field and other LED luminaires with often strictly prescribed brightness requirements, such as, in particular, signaling LED luminaires, a coding of the LED circuit arrangement with regard to its properties is useful in order to set a suitable driving of the LED circuit arrangement.

By way of example, electronic circuit arrangements of the generic type are manufactured in the form of LED modules which are assigned to different groups depending on the requirement with regard to the brightness. The brightness groups result from manufacturing tolerances during the production of the LED components. In order nevertheless to keep the LED modules of the different brightness groups within the legal standards of a specific application, it is often necessary to operate the LED modules from the different groups with different currents.

In the case of LED luminaires, for example, the drive circuit and the LED circuit arrangement are usually arranged on different carriers (e.g. rigid and/or flexible printed circuit boards) and generally produced by different manufacturers. In final assembly, these two components have to be brought together and electrically connected.

The drive signal (for example operating current) required for the electronic circuit arrangement respectively used is conventionally set manually, for example by means of pluggable jumpers on the drive circuit. In order to correspondingly identify the electronic circuit arrangement, for example in the case of LED modules, for this purpose markings are provided as early as during or directly after their production, in order that later, during final assembly, it is possible to comprehend the LED brightness group with which the module is equipped and which operating current is necessary in order to operate the LED module for example within specific brightness standard limits.

When setting the operating parameters by means of pluggable jumpers, this is preferably effected on the drive circuit. This is associated with additional outlay on account of a separate work step that is necessary. Moreover, this constitutes a fault source because jumper connections can become detached on account of permanent vibrations, as occur for example in a motor vehicle.

An alternative known possibility for setting the matching drive signal, which possibility is, however, technically complicated and therefore cost-intensive, is the use of programmable modules, such as e.g. microcontrollers.

SUMMARY OF THE INVENTION

It is an object of the present invention to provide a technically simple way of setting drive signals to different electronic circuit arrangements. The intention is to specify, in particular for LED modules, a technically simple possibility for coding them in accordance with the brightness group of the LED components which is used on the module.

This and other objects are attained in accordance with one aspect of the present invention directed to an electronic circuit arrangement, in particular an LED circuit arrangement, having a lead via which electronic circuit elements of the circuit arrangement, in particular LED components, can be driven by a drive circuit, wherein the lead has a plurality of coding conductors which carry a code by means of a combination of electrically interrupted and electrically continuous coding conductors said code giving an indication of specific properties of the circuit arrangement.

A lead according to the invention preferably has at least three conductor tracks, connecting wires or the like (generally connecting conductors) for supplying power to the circuit arrangement. A coding associated with the properties of the circuit arrangement is realized by virtue of the fact that the connecting conductors assigned to said properties are continuous and the remaining connecting conductors are electrically interrupted. The combination of electrically continuous and electrically non-continuous connecting conductors consequently comprises the coded information.

The detection of this combination or coding may be performed by means of a corresponding evaluation circuit or be effected directly by the drive circuit.

In the second-mentioned case, by way of example, the drive circuit may have a plurality of drive outputs of which only those to which electrically continuous connecting conductors are coupled are electrically conductively connected to the circuit arrangement. The setting of the parameters/functions of the drive circuit which correspond to the coding is thus effected automatically, cost-effectively, reliably, securely and to the greatest possible extent independently of external influences.

The circuit arrangement is preferably coded by severing the unrequired connecting conductors, for example by means of stamping, perforation and/or milling. In this case, the connecting conductors are preferably situated on the same carrier board as the electronic circuit arrangement, for example an LED circuit arrangement of an LED module having a plurality of LED components.

What is advantageous about the coding according to the invention is, in particular, that, on the one hand, complicated separate module markings can be obviated and, on the other hand, vibrations and comparable external effects can bring about virtually no impairment of the coding or of the electrical connection between drive circuit and circuit arrangement.

The coding may particularly advantageously be effected directly after the production of the electronic circuit arrangement or of the LED module, i.e. when it is certain which group of circuit elements is used in the circuit arrangement. The coding may be effected automatically, for example if the grouping of the circuit elements, in the case of the example the LED brightness grouping, are provided with bar codes in accordance with their parameters/functions. After the scanning of the bar code of the LED grouping, interruptions can be produced by machine.

It is particularly advantageous to detect the conductor interruptions or conductor tracks as a digital code. In this way, the parameters can be set in a simple manner. An interrupted conductor and a non-interrupted conductor can be detected as logic states "0" and "1" by means of an evaluation circuit. The evaluation circuit may feed a control signal corresponding to the coding to the drive circuit. The latter outputs to the circuit arrangement a corresponding supply voltage assigned to the coding or a corresponding supply current assigned to the coding. It is also possible for the evaluation circuit to feed a supply voltage or a supply current directly to the circuit arrangement. As an alternative, the drive circuit may offer different output combinations with different supply voltages or supply currents which are electrically coupled to the circuit arrangement automatically, depending on through-connected connecting conductors, upon connection of drive circuits and circuit arrangement.

The evaluation circuit may be arranged separately from the drive circuit and the circuit arrangement. It is also possible to generate a measurement voltage or a measurement current for the detection of interruptions in the coding conductors independently of the drive circuit.

It is advantageous for the evaluation circuit to be connected to a current/voltage supply via the drive circuit. Measurement voltages or measurement currents can thus be provided in a simple manner.

It is additionally possible for the evaluation circuit to be integrated either into the drive circuit or into the circuit arrangement.

If the evaluation circuit is assigned to the drive circuit, it is advantageous if the coding conductors are all on the one hand connected to a pole of a measurement voltage source of the drive circuit and on the other hand are electrically connected to the evaluation circuit which evaluates the coding.

This arrangement is advantageous since there is no need for any separate measuring and/or drive lines proceeding from the evaluation circuit to the coding conductors. In addition, the measurement voltage can be generated in a simple manner by the current/voltage supply of the drive circuit.

If the evaluation circuit is assigned to the LED circuit arrangement or integrated into the latter, it is advantageous if the latter can be electrically supplied by the drive circuit via the lead.

In accordance with this type of embodiment, too, the evaluation circuit does not have to generate its own measurement voltages.

The evaluation circuit is preferably a digital/analog converter. A digital/analog converter with a resistor network is particularly suitable.

It is expedient if the reference voltage of the D/A converter is the measurement voltage of the measurement voltage source.

A further coding possibility is provided by the electrical connection to a pole or a supply signal of the drive circuit being provided by a combination of conductors that are electrically connected in parallel with one another. Since these conductors that are electrically connected in parallel with one another are in each case connected in series with an electronic component, in particular a nonreactive resistor, interruptions in the conductors cause electrical conductances to be switched out, so that, in the case of an applied operating voltage, there is a corresponding decrease in the operating current as parameter for the electronic circuit arrangement.

Instead of or in supplementation of nonreactive resistors, capacitors and/or inductances may be used particularly in the case of AC voltages.

It is advantageous to keep the lead and the circuit arrangement free of additional electrical resistors that are electrically connected in series and only to equip the drive circuit with these resistors. The circuit arrangements can be constructed in a simple manner in this way.

If the coding conductors on the lead run parallel to one another, in particular access to them is simple. The production of the interruptions for the purpose of coding can be carried out in a simple manner along the path of conductors arranged parallel to one another. An automation of the coding operation can be performed in a simple manner in this way.

It is furthermore advantageous if the conductors of the lead are applied on a printed circuit board or film as carrier. This results in the formation of a lead proceeding from the drive circuit which is particularly stable mechanically. The interruption of conductors does not in this way impair the mechanical stability of other required noninterrupted conductors of the electrical power supply and of the coding.

If the circuit arrangement is applied on the same carrier as the lead, then a mechanical unit comprising the LED circuit arrangement and the coded lead is provided in a simple manner.

The coding conductors can be interrupted for coding purposes in a simple manner by perforation, stamping and/or milling or in a comparable manner. The use of lasers is equally possible for this purpose. The interruption methods mentioned are advantageous particularly for automatic coding.

The circuit arrangement and the drive circuit can preferably be connected via plug connectors. Further measures are not necessary.

The coding may preferably be used to detect the parameters or the function of an LED module as an embodiment of an LED circuit arrangement.

In this case, such an LED module may have a plurality of LEDs. Said LEDs may be arranged electrically in series and/or in parallel with one another. The coding specifies for example the brightness grouping of the LED module.

Depending on the type of LEDs and the arrangement of the LEDs with respect to one another, specific operating parameters are necessary, such as e.g. the operating current and/or the operating voltage, which can be specified via the coding.

If the conductors are formed as conductor tracks on a flexible or rigid printed circuit board, interruptions can be produced in a particularly simple manner. Wires are equally suitable in place of the conductor tracks. A specific carrier is then not necessary.

What is advantageous is a method for coding an electronic circuit arrangement, in particular an LED circuit arrangement with a lead, wherein interruptions of coding conductors are produced after the completion of the electronic circuit arrangement, in accordance with the parameters or functions thereof, by automatic perforation, stamping and/or milling or in a comparable manner.

BRIEF DESCRIPTION OF THE DRAWINGS

Further advantages, developments and advantageous embodiments of the circuit arrangement according to the invention emerge from the exemplary embodiments explained below with reference to FIGS. 1 to 10, in which:

FIG. 1 shows a circuit diagram of a first exemplary embodiment;

FIG. 2 shows a circuit diagram of a second exemplary embodiment;

DETAILED DESCRIPTION OF THE DRAWINGS

Figure 3:
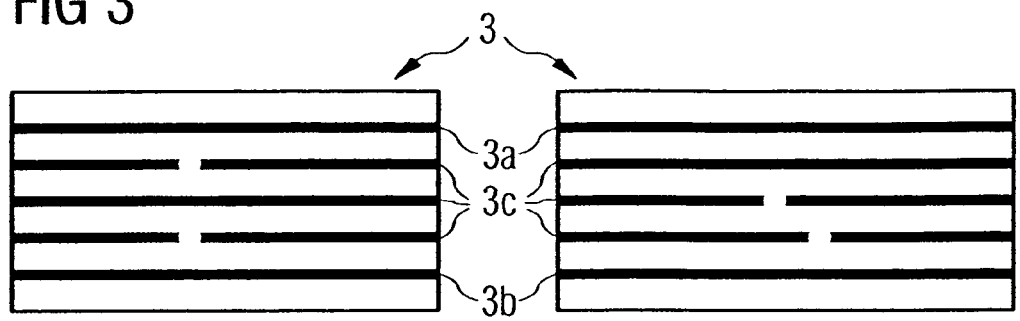
FIG. 3 shows enlarged illustrations of coded leads of the first and second exemplary embodiments in the form of exemplary combinations of interruptions.

In the exemplary embodiments, identical or identically acting constituent parts are in each case provided with the same reference symbols.

The electronic circuit arrangement of the first exemplary embodiment in accordance with FIG. 1 is an LED module 1 having three LED chains which are connected in parallel to one another and each have a plurality (here by way of example four) of series-connected LEDs 6. The supply of the LED module 1 with operating signals is provided by a lead 3 provided with a coding and having a plurality of electrical conductors, here by way of example conductor tracks 3a, 3b and 3c. In this respect, see the enlarged detail illustrations of coded leads in FIG. 3.

In all the exemplary embodiments described in the present case, the conductors of a lead 3 are provided by way of example in the form of conductor tracks arranged on a printed circuit board 10. The printed circuit board 10 may be formed in rigid or flexible fashion, for example, in the region of the lead. As an alternative, it is also possible to use other types of electrical conductors such as, for example, wires.

In the exemplary embodiment in accordance with FIG. 1, the current/voltage supply from the drive circuit 2 (here a driver module) is effected via the conductor tracks 3a and 3b. The conductor tracks 3a and 3b are connected, for example via a plug connector 4, to the supply outputs of the drive circuit 2. The drive circuit 2 is connected to an energy supply (not illustrated) by means of a further plug connection 4. A terminal 5 serves for this purpose. In this way, a coding voltage source of the drive circuit 2 is also provided.

The three conductor tracks 3c arranged by way of example between the conductor tracks 3a and 3b are not electrically connected to the parallel arrangement of the LEDs 6. Said conductor tracks 3c serve exclusively for the coding. The power supply of the LED module 1 is effected exclusively via the conductors 3a and 3b. The conductor tracks 3c may, however, also be arranged beside the conductor track pair 3a, 3b required for the current/voltage supply of the LED arrangement.

The three conductor tracks 3c may be connected in different ways to a coding voltage of an evaluation circuit 70, by means of which the coding of the conductor tracks 3c is determined.

In a first exemplary case 1 shown in FIG. 1, the evaluation circuit 70 taps each conductor track 3c separately at two ends and ascertains whether the respective conductor track 3c is continuous or interrupted. A combination of continuous and interrupted conductor tracks 3c represents the code assigned to the LED brightness grouping of the LED module 1. A measurement voltage may be applied to the conductor tracks 3c for example by the drive circuit or by the evaluation circuit itself in order to determine the code set on said conductor tracks.

In a second exemplary case of a coded lead as illustrated in FIG. 2, a measurement voltage is in each case present at the coding lines 3c on the side of the drive circuit 2. In this case, said measurement voltage is provided by the drive circuit. In this way, an evaluation circuit 71 has to tap a coding line 3c only at one end.

By way of example, the evaluation circuit 71 assigns a logic "0" to an interrupted conductor track 3c and a logic "1" to a non interrupted conductor track 3c. In this way, seven different codes and thus seven different brightness groups of the LED module 1 can be represented by the three conductor tracks. If more different codes are required, the number of coding lines on the lead can be increased in a simple manner.

On the basis of the code determined, the evaluation circuit 70 (FIG. 1) or 71 (FIG. 2) sends a corresponding control signal to the drive circuit 2 via a control line 80 or 81, respectively, the required supply parameters for the LED module 1 thereupon being set in said drive circuit.

FIG. 3 shows enlarged illustrations of the coded leads 3 of the exemplary embodiments in accordance with FIGS. 1 and 2. The middle three conductor tracks 3c (coding lines) in the left-hand illustration have the code "010" and those in the right-hand illustration have the code "100".

Figure 4:
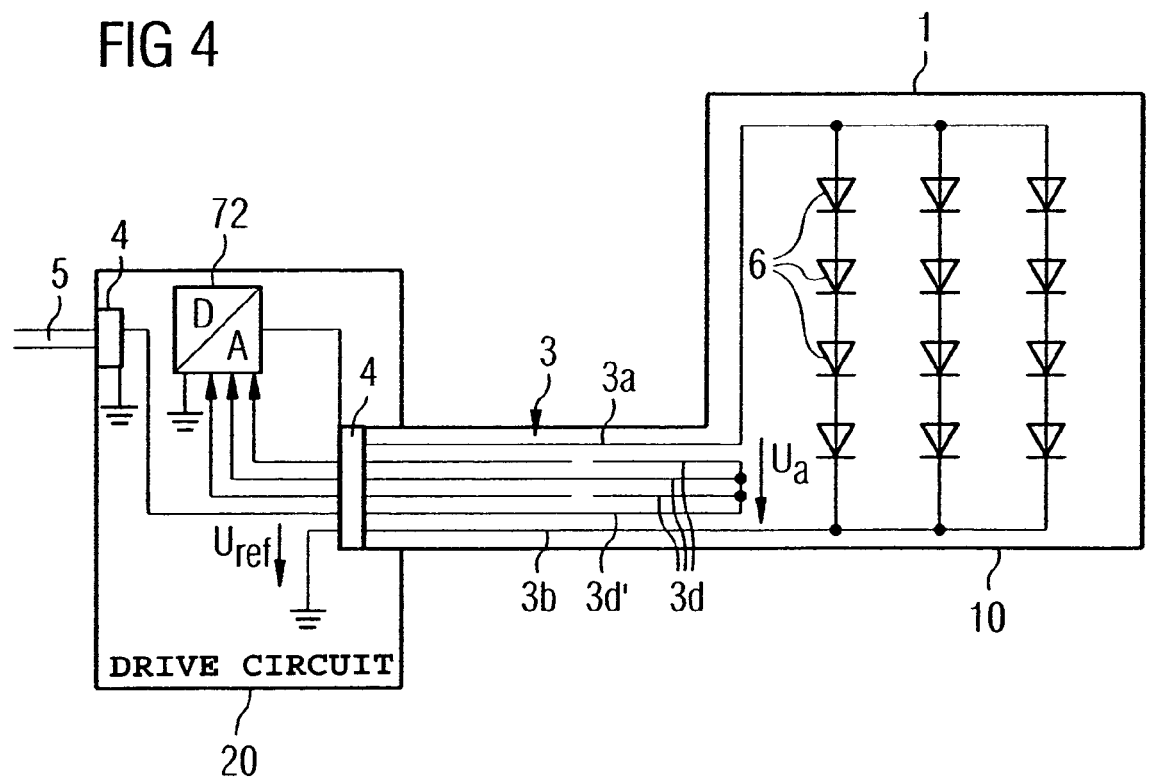
FIG. 4 shows a circuit diagram of a third exemplary embodiment.

The exemplary embodiment illustrated in FIG. 4 differs from those described above in particular by the fact that the code set by coding lines 3d can be detected via an evaluation circuit 72 integrated into the drive circuit 20.

A conductor 3d' is connected to a measurement voltage source of the drive circuit 20. A reference voltage Uref is present at said conductor 3d' with reference to a ground potential. The conductor 3d' is electrically connected to the ends of coding lines 3d on the LED module side. The respective other end of each coding line 3d is connected to the evaluation circuit 72.

The evaluation circuit 72 is a digital/analog (D/A) converter, for example, via which a supply voltage Ua can be applied directly to the LED module 1. In this case, the D/A converter has to be dimensioned such that it can drive enough current for the LED module 1.

Figure 5:
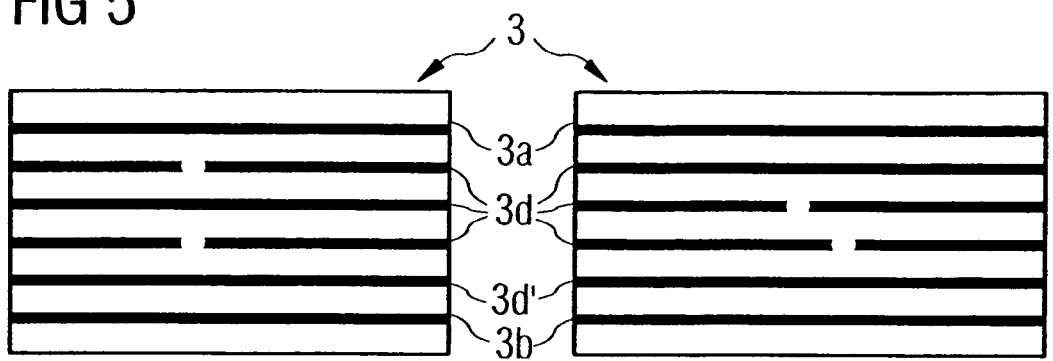
FIG. 5 shows enlarged illustrations of coded leads of the third exemplary embodiment in the form of exemplary combinations of interruptions.

FIG. 5 shows enlarged illustrations of coded leads 3 of the exemplary embodiment in accordance with FIG. 4 in the form of exemplary combinations of interrupted and non-interrupted coding conductors 3d. The conductors 3a and 3b serve for power supply, the conductors 3d serve for coding and the conductor 3d' serves for feeding voltage to the coding lines 3d.

Figure 6:
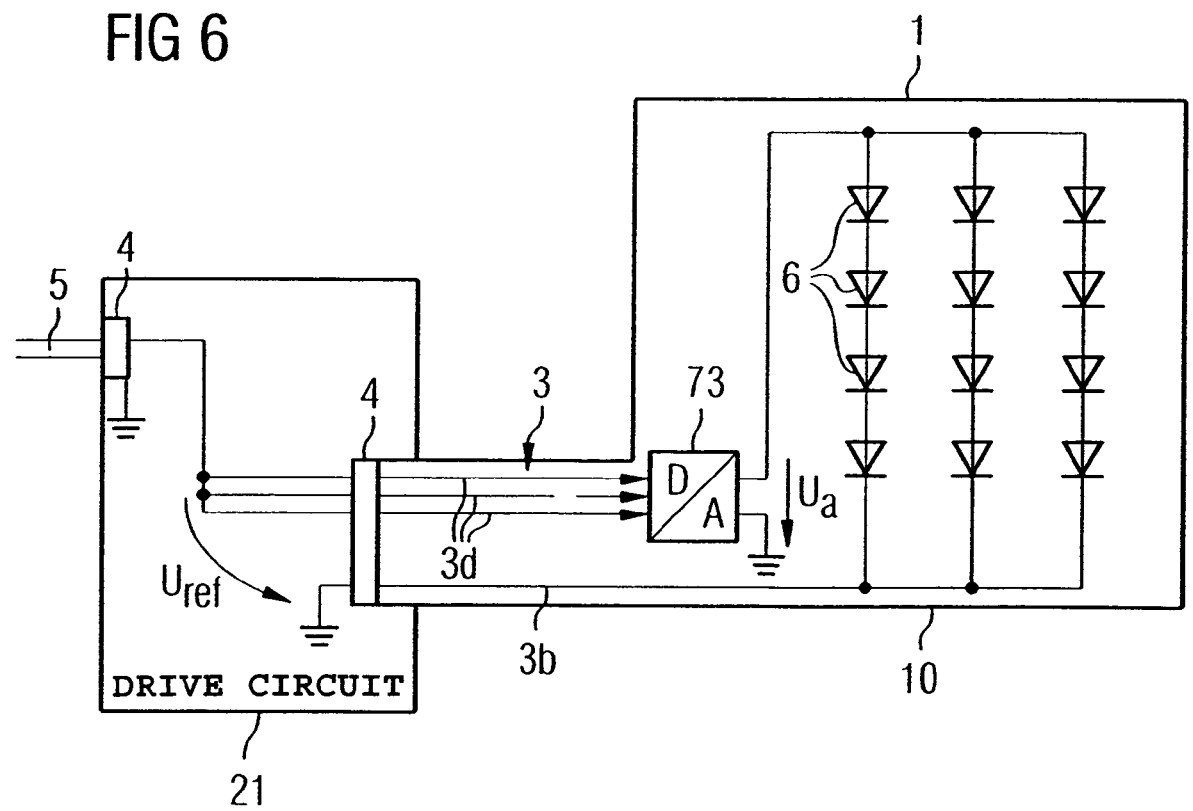
FIG. 6 shows a circuit diagram of a fourth exemplary embodiment.

The exemplary embodiment shown in FIG. 6 differs from that described in conjunction with FIG. 4 in particular by the fact that an evaluation circuit 73 is not integrated in the drive circuit 21, but rather into the LED module 1, and that one of the coding lines 3d is utilized for the current/voltage supply of the LED module 1, so that, in comparison with the exemplary embodiment of FIG. 4, the line 3a can be omitted. For the rest, the configuration of the coding is analogous to the exemplary embodiment in accordance with FIG. 4.

Accordingly, at least one of the conductors 3d serves both for coding and, together with a conductor 3b, for the current/voltage supply of the LED module 1.

The evaluation circuit 73 is a digital/analog (D/A) converter via which a supply voltage Ua can be applied directly to the LED module 1. The D/A converter is dimensioned such that it can drive enough current for the LED module 1.

Figure 7:
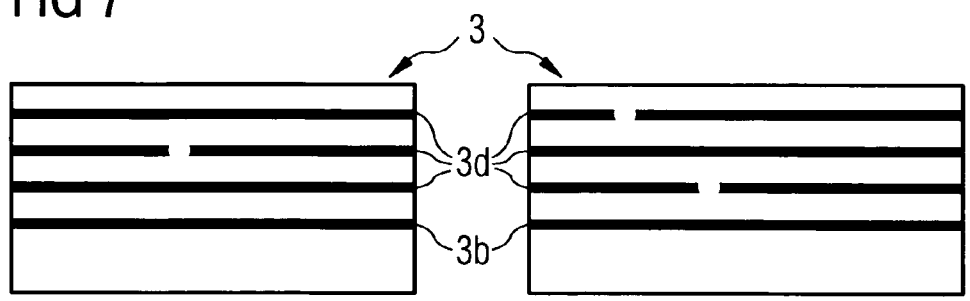
FIG. 7 shows enlarged illustrations of coded leads of the fourth exemplary embodiment in the form of exemplary combinations of interruptions.

FIG. 7 in turn shows enlarged illustrations of coded leads 3 in accordance with the exemplary embodiment described in conjunction with FIG. 6 in the form of exemplary combinations of interrupted and non-interrupted coding conductors 3d. Four conductor tracks are formed. The supply conductor 3b connects the LED module 1 to the ground potential or a different reference potential. The coding conductors 3d serve for coding in accordance with the brightness grouping of the LED module 1. At least one continuous coding conductor 3d is utilized as a second supply conductor for the LED module 1.

Figure 8:
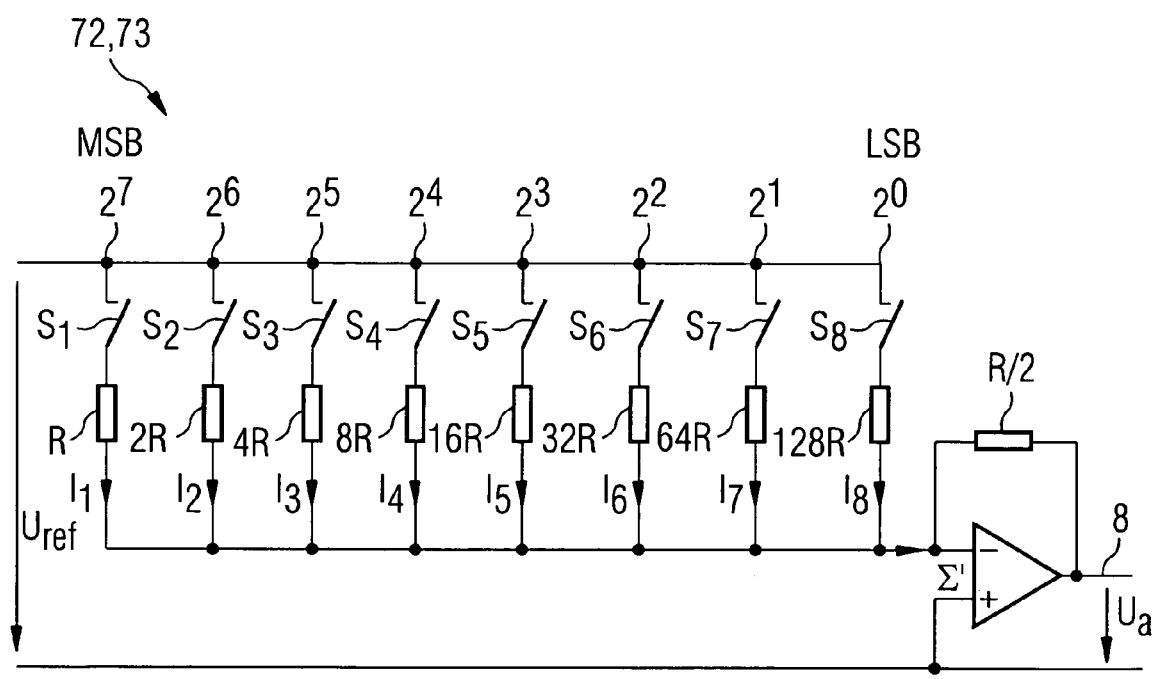
FIG. 8 shows an exemplary embodiment of an evaluation circuit in the form of a digital/analog (D/A) converter.

FIG. 8 shows an example of an evaluation circuit 72, 73 in the form of a digital/analog (D/A) converter.

In the D/A converter, a respective electrical resistor is connected in series with each conductor serving for coding. These resistors are binary-stepped with respect to one another and form a resistor network. The measurement voltage provided by the measurement voltage source can thus be applied to said electrical resistors in accordance with the coding. The currents generated in this case are fed to a summing inverting operational amplifier, which outputs a corresponding control voltage at its output via a control line 8. The current through a feedback resistor R/2 completely compensates the total current through the electrical resistors.

Figure 9:
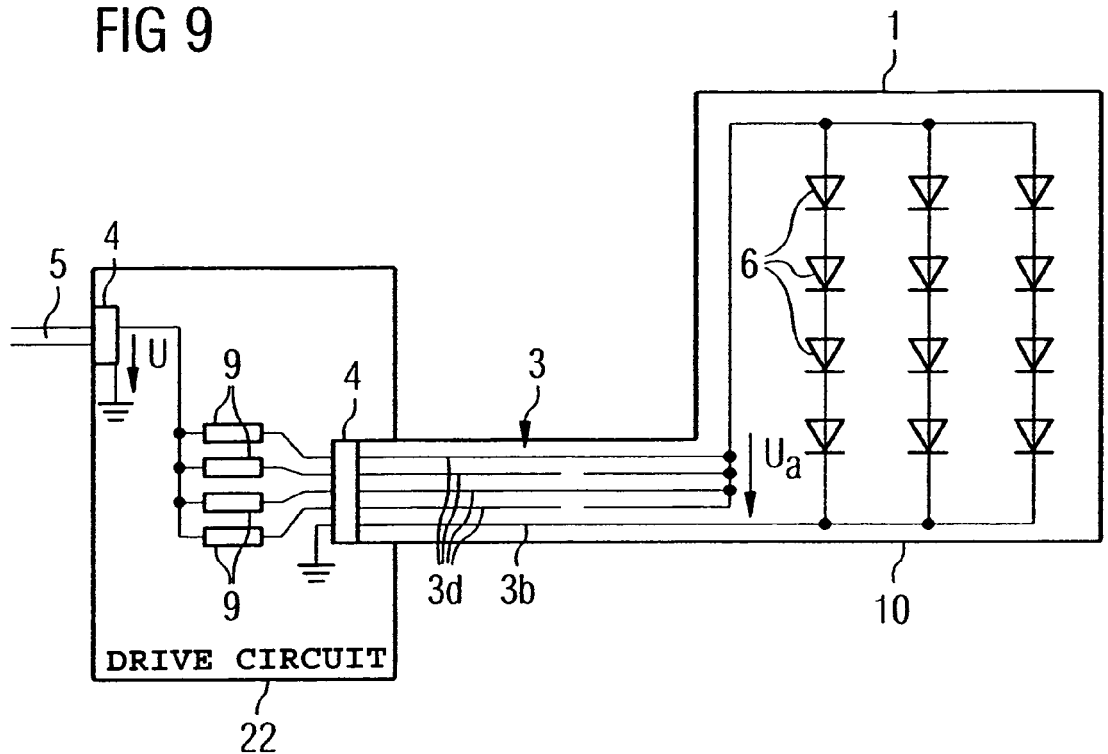
FIG. 9 shows a circuit diagram of a fifth exemplary embodiment.

The exemplary embodiment in accordance with FIG. 9 represents a technically particularly simple and therefore particularly preferred implementation of the principle according to the invention.

A supply conductor track 3b electrically connects an LED module 1 (for example identical to the LED modules explained above) to the ground pole or a different reference potential of the drive circuit 22. The electrical connection to the other pole of the drive circuit 22 is effected via at least one continuous coding conductor of the plurality of coding conductors 3d of the lead 3. Accordingly, here, too, the conductor tracks 3d serve both for coding and, together with the supply line 3b, for the power supply of the LED module 1. The drive circuit has a plurality of outputs which provide different output signals. Only that output or that combination of outputs to which a non-interrupted coding line 3d is assigned or to which non-interrupted coding lines 3d are assigned is electrically connected to the LED module 1.

It is possible to use an arbitrary number of conductor tracks 3d connected in parallel with one another for the coding and/or for the power supply. It is also possible that a plurality of groups are formed from conductor tracks 3d connected in parallel with one another, different voltages for example being present at said groups.

Electrical resistors 9 arranged in the drive circuit 22 are preferably connected in series with the coding conductors 3d that are electrically connected in parallel with one another. A supply voltage U can be fed to the LED module 1 via said resistors 9. Electrical conductances are switched out depending on the interruption of the coding conductors 3d. The operating parameters for the LED module 1 can thus be set in a simple manner.

Figure 10:
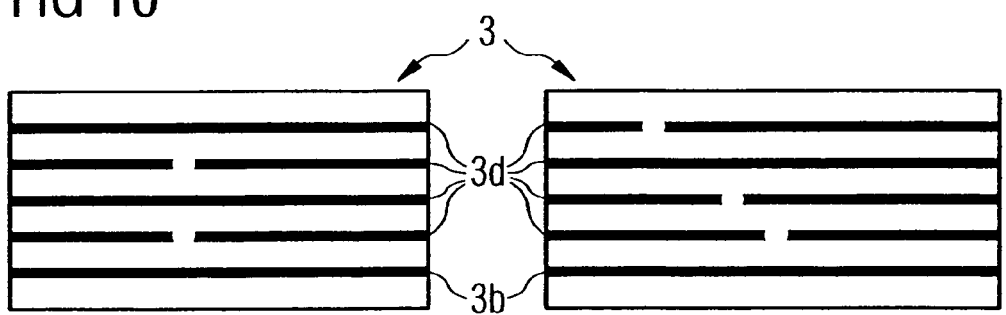
FIG. 10 shows enlarged illustrations of coded leads of the fifth exemplary embodiment in the form of exemplary combinations of interruptions.

FIG. 10 in turn shows enlarged illustrations of coded leads 3 in accordance with the exemplary embodiment described in conjunction with FIG. 9 in the form of exemplary combinations of interrupted and non-interrupted coding conductors 3d. Five conductor tracks 3b, 3d are formed. The supply conductor 3b connects the LED module 1 to the ground potential or a different reference potential. The coding conductors 3d serve for coding in accordance with the brightness grouping of the LED module 1. At least one continuous coding conductor 3d is utilized as a second supply conductor for the LED module 1.

The coding may be performed by standard processes such as perforation, stamping, milling, etc. in flexible printed circuit boards and also in rigid printed circuit board materials. The interruptions may be positioned arbitrarily on the lead 3, to be precise even very near to the LED module 1. In this way, it is possible to use a universal drive circuit for arbitrary electronic circuit arrangements or LED modules 1. In principle, interruptions may also be formed in the drive circuit.

It is also possible to use, instead of the conductor tracks, conventional electrical conductors in the form of wires and the like. For a coding, said wires have to be completely severed or separated.

It goes without saying that the description of the invention on the basis of the exemplary embodiments is not to be understood as a restriction of the invention thereto, in particular not to LED modules. Rather, an electronic circuit arrangement already makes use of the technical teaching according to the invention as soon as a power supply and a coding with regard to the parameters are effected via electrical conductors of a lead which are coded by interruptions.

The invention encompasses any new feature and also any combination of features, which in particular comprises any combination of features in the patent claims, even if said combination is not specified explicitly in the patent claims.

We claim:

1. An electronic LED circuit arrangement, comprising:
   a lead, via which electronic circuit elements of the LED circuit arrangement comprising LED components are drivable by a drive circuit; and
   an evaluation circuit located in the LED circuit arrangement, the evaluation circuit being a digital/analog converter comprising a resistor network;
   wherein the lead has a plurality of coding conductors, which carry a code by means of a combination of electrically interrupted and electrically continuous coding conductors, said code giving an indication of specific properties of the LED circuit arrangement; and
   wherein said evaluation circuit is adapted to detect said code, and a reference voltage (Uref) of the digital/analog converter (D/A) is a measurement voltage provided by a measurement voltage source.

2. The electronic LED circuit arrangement as claimed in claim 1, wherein the evaluation circuit passes a corresponding control signal to the drive circuit.

3. The electronic LED circuit arrangement as claimed in claim 1, wherein an interrupted coding conductor represents the logic state "0" and a non-interrupted coding conductor represents the logic state "1".

4. The electronic LED circuit arrangement as claimed in claim 2, wherein at least two coding conductors are individually connectable to a measurement voltage source of the drive circuit and the coding conductors are furthermore connectable to the evaluation circuit.

5. The electronic LED circuit arrangement as claimed in claim 1, wherein an electrical supply line for the circuit elements is provided by at least one electrically continuous coding conductor.

6. The electronic LED circuit arrangement as claimed in claim 1, wherein the lead and the circuit arrangement are arranged on a common carrier.

7. The electronic LED circuit arrangement as claimed in claim 1, wherein the lead is arranged on a flexible part of a carrier.

8. The electronic LED circuit arrangement as claimed in claim 1, wherein the coding conductors are interruptable by perforation, stamping and/or milling.

9. The electronic LED circuit arrangement as claimed in claim 1, wherein the lead is electrically connectable to the drive circuit and/or to the circuit arrangement by plug connectors.

10. The electronic LED circuit arrangement as claimed in claim 1, wherein the LED circuit arrangement has a plurality of LED chains each having a plurality of LED components, said LED chains being electrically connected in parallel with one another.

11. The electronic LED circuit arrangement as claimed in claim 10, wherein the coding is correlated by the brightness grouping of the LED components used in the LED circuit arrangement.

12. A method for coding an electronic LED circuit arrangement, as claimed in claim 1, wherein the lead is coded by perforation, stamping and/or milling after the completion of the electronic LED circuit arrangement, in accordance with the properties, parameters and/or functions of said electronic LED circuit arrangement.

13. The electronic LED circuit arrangement as claimed in claim 6, wherein the common carrier comprises a printed circuit board.

* * * * *